United States Patent
Yu

(10) Patent No.: US 8,552,474 B2
(45) Date of Patent: Oct. 8, 2013

(54) JUNCTION FIELD EFFECT TRANSISTOR STRUCTURE

(75) Inventor: Rongwei Yu, Chengdu (CN)

(73) Assignee: IPGoal Microelectronics (SiChuan) Co., Ltd., Chengdu, Sichuan Province (CN)

( * ) Notice: Subject to any disclaimer, the term of this patent is extended or adjusted under 35 U.S.C. 154(b) by 298 days.

(21) Appl. No.: 13/172,857

(22) Filed: Jun. 30, 2011

(65) Prior Publication Data

US 2012/0001240 A1  Jan. 5, 2012

(30) Foreign Application Priority Data

Jun. 30, 2010 (CN) ...................... 2010 2 0242737 U

(51) Int. Cl.
*H01L 29/80* (2006.01)
(52) U.S. Cl.
USPC .................................. 257/256; 257/E29.226
(58) Field of Classification Search
None
See application file for complete search history.

(56) References Cited

U.S. PATENT DOCUMENTS

2008/0067560 A1* 3/2008 Knaipp .......................... 257/285
2008/0191316 A1* 8/2008 Lee ................................ 257/592

* cited by examiner

*Primary Examiner* — W. Wendy Kuo

(57) ABSTRACT

A junction field effect transistor structure includes a grid electrode, a source electrode, a drain electrode and a substrate. The grid electrode includes a polysilicon layer and a P-type implanted layer. The source electrode includes an N-type implanted layer, an N-type well layer and a heavy-implanted N-type well layer. The drain electrode includes the N-type implanted layer, the N-type well layer and the heavy-implanted N-type well layer. The substrate is connected with a substrate connecting end by the P-type implanted layer, a P-type well layer, a heavy-implanted P-type well layer and a P-type buried layer. The junction field effect transistor structure of the present invention can be manufactured without adding any masking step based on the existing technologies, and has the high-voltage resistant characteristic to meet the requirements in practical applications. Furthermore, it has the compact structure and compatible technology.

16 Claims, 3 Drawing Sheets

JUNCTION FIELD EFFECT TRANSISTOR STRUCTURE

BACKGROUND OF THE PRESENT INVENTION

1. Field of Invention

The present invention relates to a transistor structure, and more particularly to a junction field effect transistor (JFET) structure with the high-voltage resistant characteristic.

2. Description of Related Arts

The junction field effect transistors (JFETs) are often used in the power chip. JFET is a unipolar three-layer transistor and a field effect transistor whose control electrode is made up of PN junction. It depends on the movement of a current carrier such as electrons or holes. For a normal operating device, when the drain-to-source voltage of the N-channel JFET is positive, or the drain-to-source voltage of the P-channel JFET is negative, the current passes through the channel. The current in the channel of the JFET is controlled by the grid voltage. To pinch off the flow of the current, the grid-to-source voltage of the N-channel JFET must be negative; or the grid-to-source voltage of the P-channel JFET must be positive. The grid voltage is applied to the channel across the PN junction in the JFET. On the contrary, the grid voltage is applied to the insulator in the MOSFET.

In practical applications, a JFET structure with the high-voltage resistant characteristic is needed. Therefore, it is necessary to provide a new JFET structure with the high-voltage resistant characteristic as required.

SUMMARY OF THE PRESENT INVENTION

An object of the present invention is to provide a junction field effect transistor (JFET) structure which has the high-voltage resistant characteristic.

Accordingly, in order to accomplish the above object, the present invention provides a junction field effect transistor structure, comprising:

a grid electrode comprising a polysilicon layer and a P-type implanted layer;

a source electrode comprising an N-type implanted layer, an N-type well layer and a heavy-implanted N-type well layer;

a drain electrode having a same structure with the source electrode; and a substrate connected with a substrate connecting end by the P-type implanted layer, a P-type well layer, a heavy-implanted P-type well layer and a P-type buried layer.

Preferably, the drain electrode is located in a center of the junction field effect transistor structure, the source electrode is located around the drain electrode, and the grid electrode is located between the drain electrode and the source electrode.

Preferably, the junction field effect transistor structure further comprises a field-oxide layer and an N-type epitaxial layer adjacent to the field-oxide layer.

Preferably, the substrate is P-type, and the substrate connecting end is P-type.

Preferably, the junction field effect transistor structure is an N-channel junction field effect transistor structure.

Compared with the prior art, the junction field effect transistor structure of the present invention can be manufactured without adding any masking step based on the existing technologies, and has the high-voltage resistant characteristic to meet the demands in practical applications. Furthermore, it has the compact structure and compatible technology.

These and other objectives, features, and advantages of the present invention will become apparent from the following detailed description, the accompanying drawings, and the appended claims.

DETAILED DESCRIPTION OF THE PREFERRED EMBODIMENT

Figure 1:
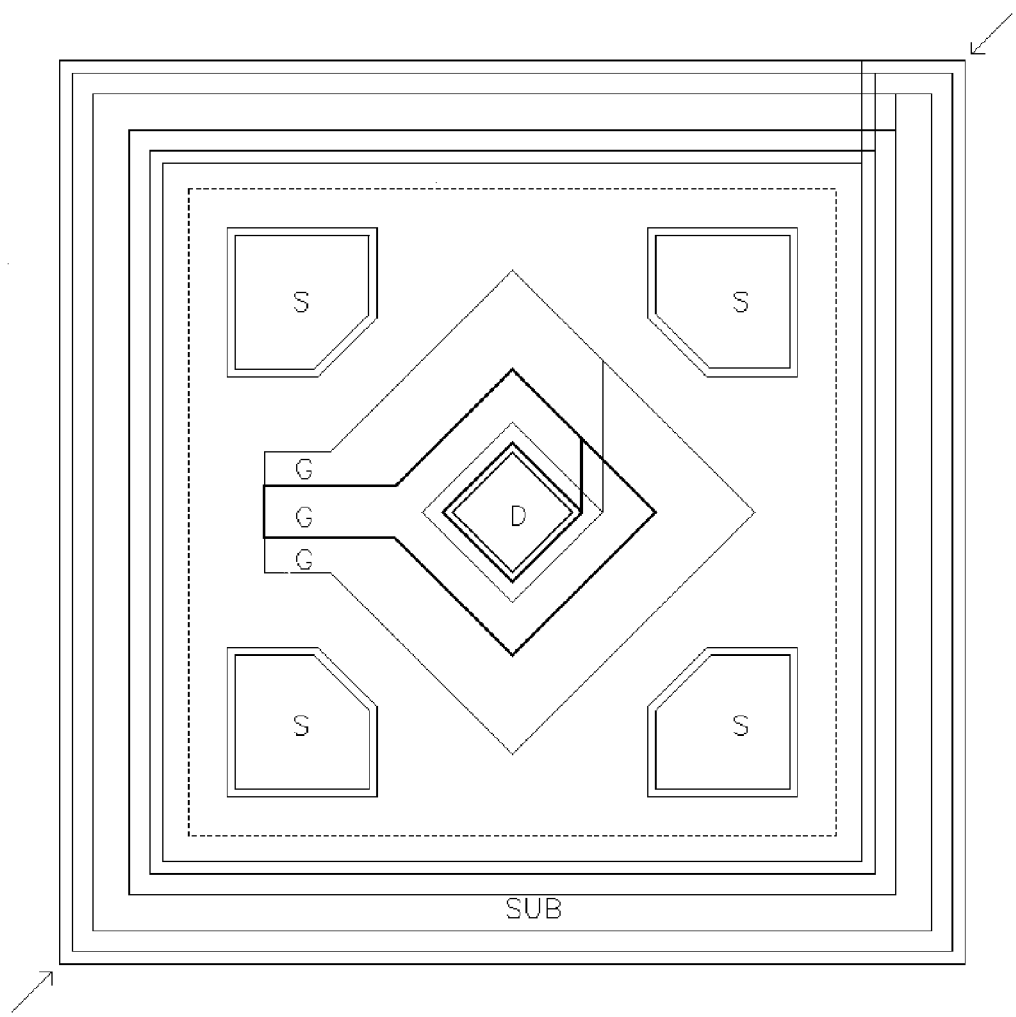
FIG. 1 is a plan sketch of a junction field effect transistor structure according to a preferred embodiment of the present invention.

Referring to FIG. 1 of the drawings, a junction field effect transistor (JFET) structure according to a preferred embodiment of the present invention is illustrated, wherein the junction field effect transistor (JFET) structure comprises a drain electrode D, a source electrode S, a grid electrode G and a P-type substrate PSUB. The planar relationship among the electrodes of the JFET is shown in FIG. 1. The drain electrode D is located in the center of the JFET structure, the source electrode S is located around the drain electrode D, and the grid electrode G is located between the drain electrode D and the source electrode S.

Figure 2:
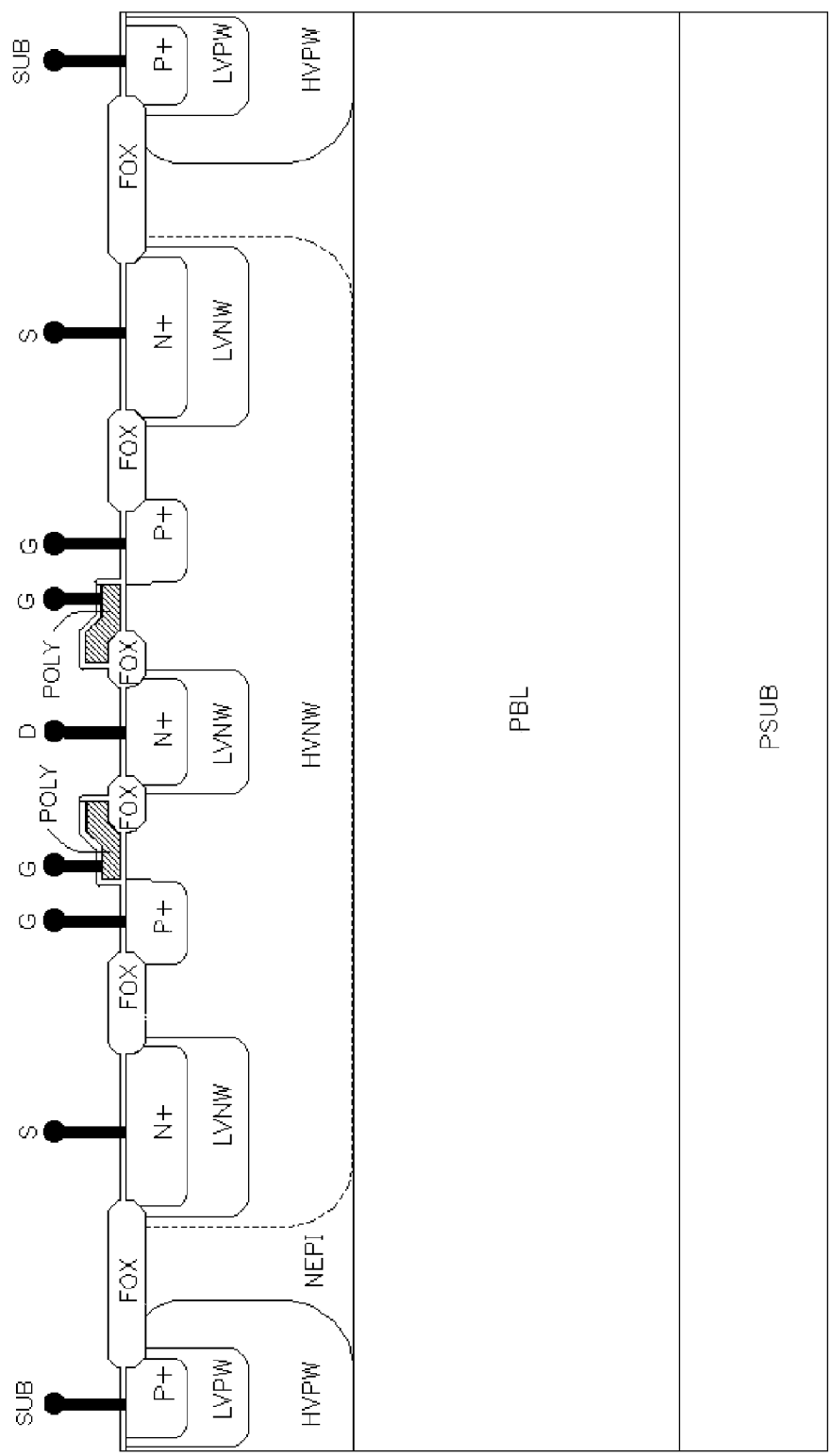
FIG. 2 is a sectional view of the junction field effect transistor structure according to the preferred embodiment of the present invention.

FIG. 2 is a sectional view of the JFET structure which is cut along the 45-degree diagonal direction, namely, the direction of the arrow shown in FIG. 1. As shown in FIG. 2, the sectional structure of the JFET comprises a field-oxide layer FOX, a P-type implanted layer P+, a P-type well layer LVPW, a heavy-implanted P-type well layer HVPW, an N-type epitaxial layer NEPI, an N-type implanted layer N+, an N-type well layer LVNW, a heavy-implanted N-type well layer HVNW, a P-type buried layer PBL, a polysilicon layer POLY, a P-type substrate PSUB, a drain electrode D, a source electrode S, a grid electrode G and a P-type substrate connecting end SUB.

The source electrode S comprises the N-type implanted layer N+, the N-type well layer LVNW and the heavy-implanted N-type well layer HVNW. The drain electrode D comprises the N-type implanted layer N+, the N-type well layer LVNW and the heavy-implanted N-type well layer HVNW. The grid electrode G comprises the polysilicon layer POLY and the P-type implanted layer P+. The P-type substrate connecting end SUB is connected with the P-type substrate PSUB by the P-type implanted layer P+, the P-type well layer LVPW, the heavy-implanted P-type well layer HVPW and the P-type buried layer PBL.

The N-type well layer LVNW is provided within the N-type heavy-implanted well layer HVNW. The N-type implanted layer N+ is provided on the N-type well layer LVNW. The P-type implanted layer P+ of the grid electrode G is provided within the N-type heavy-implanted well layer HVNW and provided between the N-type well layer LVNW of the source electrode S and the N-type well layer LVNW of the drain electrode D. The polysilicon layer is provided above the P-type implanted layer P+. The P-type buried layer PBL is provided on the substrate. The P-type heavy-implanted well layer HVPW is provided on the buried layer. The P-type well layer LVPW is provided within the P-type heavy-implanted well layer HVPW. The implanted layer P+ is provided on the P-type well layer LVPW.

Figure 3:
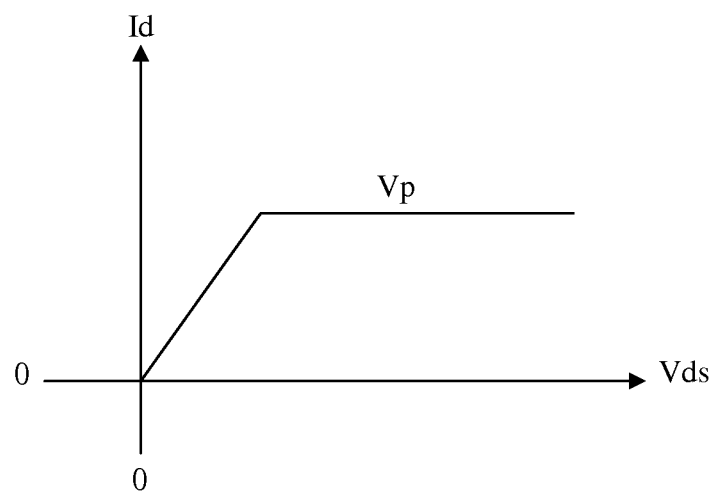
FIG. 3 is an electrical characteristic curve of the junction field effect transistor structure according to the preferred embodiment of the present invention.

FIG. 3 is an electrical characteristic curve of the junction field effect transistor structure according to the preferred embodiment of the present invention. The electrical characteristics of the JFET of the present invention are similar to those of the common field effect transistor, wherein Vp is the pinch-off voltage, Id is the drain current, Vds is the drain-to-source voltage.

The JFET structure of the present invention is manufactured based on the N-type epitaxial BiCMOS technology. FIG. 1 is a layout of the N-channel JFET. The N-channel JFET is a depletion mode field effect transistor which uses the heavy-implanted N-type well layer HVNW as the channel. The source electrode S and the drain electrode D are formed by diffusing the low-pressure N-type well layer LVNW and then implanting the N-type impurities. The grid electrode is formed by implanting the P-type impurities and then covering the polysilicon layer POLY thereon. The back grid is formed by pushing in the P-type buried layer. The whole device is located within the P-type isolated island. The smaller the channel width of the N-type heavy well JFET is, the smaller the pinch-off voltage is. The present structure provides the design choices for the circuit designers in the power management and analog circuits, such as the analog switch circuits, bias circuits, replacing the resistors with high resistance in the start-up circuits and the place where the high-voltage resistant characteristic is needed.

Based on the BiCMOS technology, the present invention provides a new junction field effect transistor structure. The junction field effect transistor structure of the present invention can be manufactured without adding any masking step based on the existing technologies, and has the high-voltage resistant characteristic to meet the demands in practical applications. Furthermore, it has the compact structure and compatible technology.

One skilled in the art will understand that the embodiment of the present invention as shown in the drawings and described above is exemplary only and not intended to be limiting.

It will thus be seen that the objects of the present invention have been fully and effectively accomplished. Its embodiments have been shown and described for the purposes of illustrating the functional and structural principles of the present invention and is subject to change without departure from such principles. Therefore, this invention includes all modifications encompassed within the spirit and scope of the following claims.

What is claimed is:

1. A junction field effect transistor structure, having a substrate connecting end, comprising:
   a substrate of a first conductivity type;
   a source electrode comprising a heavy-implanted well layer of a second conductivity type, a well layer of said second conductivity type provided within said heavy-implanted well layer of said second conductivity type, and an implanted layer of said second conductivity type provided on said well layer of said second conductivity type;
   a drain electrode having a same structure with said source electrode;
   a grid electrode comprising a first implanted layer of said first conductivity type provided within said heavy-implanted well layer of said second conductivity type, and a polysilicon layer provided above said first implanted layer of said first conductivity type;
   a buried layer of said first conductivity type provided on said substrate;
   a heavy-implanted well layer of said first conductivity type provided on said buried layer;
   a well layer of said first conductivity type provided within said heavy-implanted well layer of said first conductivity type; and
   a second implanted layer of said first conductivity type provided on said well layer of said first conductivity type,
   wherein the substrate connecting end is connected with said substrate by said buried layer of said first conductivity type, said heavy-implanted well layer of said first conductivity type, said well layer of said first conductivity type and said second implanted layer of said first conductivity type.

2. The junction field effect transistor structure, as recited in claim 1, wherein said drain electrode is located in a center of said junction field effect transistor structure, said source electrode is located around said drain electrode, said grid electrode is located between said drain electrode and said source electrode.

3. The junction field effect transistor structure, as recited in claim 1, further comprising a field-oxide layer and an N-type epitaxial layer adjacent to said field-oxide layer.

4. The junction field effect transistor structure, as recited in claim 2, further comprising a field-oxide layer and an N-type epitaxial layer adjacent to said field-oxide layer.

5. The junction field effect transistor structure, as recited in claim 1, wherein said substrate is P-type, and said substrate connecting end is P-type.

6. The junction field effect transistor structure, as recited in claim 2, wherein said substrate is P-type, and said substrate connecting end is P-type.

7. The junction field effect transistor structure, as recited in claim 3, wherein said substrate is P-type, and said substrate connecting end is P-type.

8. The junction field effect transistor structure, as recited in claim 4, wherein said substrate is P-type, and said substrate connecting end is P-type.

9. The junction field effect transistor structure, as recited in claim 1, wherein said junction field effect transistor structure is an N-channel junction field effect transistor structure.

10. The junction field effect transistor structure, as recited in claim 2, wherein said junction field effect transistor structure is an N-channel junction field effect transistor structure.

11. The junction field effect transistor structure, as recited in claim 3, wherein said junction field effect transistor structure is an N-channel junction field effect transistor structure.

12. The junction field effect transistor structure, as recited in claim 4, wherein said junction field effect transistor structure is an N-channel junction field effect transistor structure.

13. The junction field effect transistor structure, as recited in claim 5, wherein said junction field effect transistor structure is an N-channel junction field effect transistor structure.

14. The junction field effect transistor structure, as recited in claim 6, wherein said junction field effect transistor structure is an N-channel junction field effect transistor structure.

15. The junction field effect transistor structure, as recited in claim 7, wherein said junction field effect transistor structure is an N-channel junction field effect transistor structure.

16. The junction field effect transistor structure, as recited in claim 8, wherein said junction field effect transistor structure is an N-channel junction field effect transistor structure.

* * * * *